(12) United States Patent
Aihara

(10) Patent No.: US 7,506,457 B2
(45) Date of Patent: Mar. 24, 2009

(54) SUBSTRATE TREATING APPARATUS

(75) Inventor: Tomoaki Aihara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 116 days.

(21) Appl. No.: 11/767,379

(22) Filed: Jun. 22, 2007

(65) Prior Publication Data

US 2007/0295375 A1    Dec. 27, 2007

(30) Foreign Application Priority Data

Jun. 26, 2006   (JP) .............................. 2006-175331

(51) Int. Cl.
  *F26B 13/10*   (2006.01)
(52) U.S. Cl. .............................. 34/526; 34/559; 34/565; 134/95.2; 134/102.3; 134/902
(58) Field of Classification Search .................... 34/526, 34/558, 559, 565, 570, 60, 92, 402, 403, 34/406; 134/18, 21, 26, 37, 95.2, 102.3, 134/902, 56 R
See application file for complete search history.

(56) References Cited

U.S. PATENT DOCUMENTS 6,790,291 B2 *   9/2004   Kimura ................... 134/102.3
2002/0155709 A1   10/2002   Toshima et al.
2006/0112973 A1   6/2006   Nagami

FOREIGN PATENT DOCUMENTS

JP        11-87302       3/1999
JP        2002-134464    5/2002
JP        2006-156648    6/2006

* cited by examiner

*Primary Examiner*—Jiping Lu
(74) *Attorney, Agent, or Firm*—Ostrolenk, Faber, Gerb & Soffen, LLP

(57) ABSTRACT

A substrate treating apparatus for drying substrates by moving the substrates out of a treating liquid into a solvent atmosphere. The apparatus includes a treating tank for storing the treating liquid, a chamber enclosing the treating tank, a holding mechanism for holding the substrates, the holding mechanism being vertically movable between a treating position in the treating tank and a drying position in the chamber and above the treating tank, a supply device for supplying vapor of a solvent into the chamber, a buffer tank disposed outside the chamber for collecting the treating liquid discharged from the treating tank, a first vacuum pump for decompressing the chamber, a second vacuum pump for decompressing the buffer tank, and a controller for operating the supply device to fill the chamber with the solvent atmosphere, operating the holding mechanism to move the substrates from the treating position to the drying position, operating the first vacuum pump to decompress the chamber to a first pressure, and operating the second vacuum pump to adjust a pressure in the buffer tank to a second pressure equal to or lower than the first pressure before the treating liquid in the treating tank is discharged into the buffer tank.

20 Claims, 4 Drawing Sheets

Fig. 2

| component \ process | S1 loading | S2 reduce oxygen concentration | S3 chemical treatment | S4 deionized water cleaning | S5 surface replacement with IPA | S6 fill IPA vapor | S7 cover wafer surfaces with IPA | S8 | S9 reduced-pressure drying (QDR) | S10 | S11 pressure recovery | S12 unloading | S13 standby |
|---|---|---|---|---|---|---|---|---|---|---|---|---|---|
| lifter standby position | ○ | | | | | | | | | | | ○ | ○ |
| lifter drying position | | ○ | | | | | | ○ | ○ | ○ | ○ | | |
| lifter treating position | | | ○ | ○ | ○ | ○ | ○ | | | | | | |
| treating liquid valve | | | open | open | | | | | | | | | |
| drain valve | open | open | open | open | open | open | open | open | open | | open | | open |
| QDR valve | | | | | | | | | open | | open | | |
| 1st vacuum pump | | | | | | | | | | ON | | | |
| 2nd vacuum pump | | | | | | | | ON | ON | ON | | | |
| 3rd vacuum pump | | | | | | | | ON | ON | ON | | | |
| inert gas valve | | open | open | open | open | open | open | | | | open | | open |
| vapor valve | | | open | open | open | open | open | | | | | | |
| breather valve | | open | open | open | open | | | | | | open | | |
| buffer tank drain valve | | open | open | open | open | | | | | | | open | |

Fig. 4

| component / process | S1 loading | S2 reduce oxygen concentration | S3 chemical treatment | S4 deionized water cleaning | S5 surface replacement with IPA | S6 fill IPA vapor | S7 cover wafer surfaces with IPA | S21 QDR | S22 reduced-pressure drying | S11 pressure recovery | S12 unloading | S13 standby |
|---|---|---|---|---|---|---|---|---|---|---|---|---|
| lifter standby position | | | | | | | | | | | | ○ |
| lifter drying position | | ○ | | | | | | ○ | ○ | ○ | ○ | |
| lifter treating position | ○ | | ○ | ○ | ○ | ○ | ○ | | | | | |
| treating liquid valve | | | open | open | open | open | open | | | | | open |
| drain valve | open | open | open | | | | | open | open | open | | |
| QDR valve | | | | | | | | open | open | | | |
| 1st vaccum pump | | | | | | | | | ON | | | |
| 2nd vaccum pump | | | | | | | | | ON | | | |
| 3rd vaccum pump | | | | | | | | ON | ON | | | |
| inert gas valve | | open | | open | open | open | | | | open | | open |
| vapor valve | | | | | open | open | open | | | | | |
| breather valve | | open | open | open | open | | | | | open | | |
| buffer tank drain valve | | | | | | | | | | | open | |

SUBSTRATE TREATING APPARATUS

BACKGROUND OF THE INVENTION (1) Field of the Invention

This invention relates a substrate treating apparatus for drying substrates such as semiconductor wafers or glass substrates for liquid crystal displays (hereinafter called simply substrates). More particularly, the invention relates to a technique for drying substrates by moving the substrates out of a treating liquid into a solvent atmosphere while a chamber of the solvent atmosphere is decompressed.

(2) Description of the Related Art

A conventional apparatus of this type includes a treating tank for storing deionized water, a chamber enclosing the treating tank, a holding mechanism for vertically moving substrates between a treating position inside the treating tank and a drying position above the treating tank, nozzles for supplying a vapor of isopropyl alcohol (IPA) into the chamber, a vacuum pump for decompressing the chamber, and a drain pipe for discharging the deionized water from the treating tank to the exterior of the chamber (see Japanese Unexamined Patent Publication H11-87302 (1999), for example).

In the apparatus of such construction, a lift arm is first moved to the treating position to have substrates cleaned with deionized water. Then, a vapor of isopropyl alcohol is supplied from the nozzles to fill the chamber with a solvent atmosphere. Subsequently, the holding mechanism is moved to the drying position. Next, the vacuum pump is operated to decompress the chamber, and the isopropyl alcohol adhering to the substrates is dried to dry the substrates.

The conventional apparatus with the above construction has the following drawbacks.

In the conventional apparatus, deionized water stored in the treating tank inside the decompressed chamber could have an adverse influence on drying treatment of the substrates. It is therefore necessary to discharge the deionized water from the treating tank in the state of atmospheric pressure before decompressing the chamber. That is, since the water cannot be drained during decompression of the chamber, there is a problem of low throughput of substrate treatment from treatment with the treating liquid to drying treatment.

In order to avoid the above inconvenience, it is conceivable to discharge deionized water from the treating tank while pressurizing the inside of the chamber with an inert gas such as nitrogen, for example, after forming a solvent atmosphere and decompressing the chamber. However, such pressurization condenses the vapor of isopropyl alcohol in the chamber, whereby isopropyl alcohol adheres to the substrates as droplets producing a residue thereon. This poses a different problem that the substrates cannot be dried clean.

SUMMARY OF THE INVENTION

This invention has been made having regard to the state of the art noted above, and its object is provide a substrate treating apparatus that enables draining of water even under decompression by adjusting pressure inside and outside a chamber, thereby treating substrates in a clean state while assuring improved throughput of substrate treatment.

A substrate treating apparatus, according to this invention, for drying substrates by moving the substrates out of a treating liquid into a solvent atmosphere, comprises a treating tank for storing the treating liquid; a chamber enclosing the treating tank; a holding mechanism for holding the substrates, the holding mechanism being vertically movable between a treating position in the treating tank and a drying position in the chamber and above the treating tank; a supply device for supplying vapor of a solvent into the chamber; a buffer tank disposed outside the chamber for collecting the treating liquid discharged from the treating tank; a first decompressing device for decompressing the chamber; a second decompressing device for decompressing the buffer tank; and a control device for operating the supply device to fill the chamber with the solvent atmosphere, operating the holding mechanism to move the substrates from the treating position to the drying position, operating the first decompressing device to decompress the chamber to a first pressure, and operating the second decompressing device to adjust a pressure in the buffer tank to a second pressure equal to or lower than the first pressure before the treating liquid in the treating tank is discharged into the buffer tank.

According to this invention, the control device fills the chamber with a solvent atmosphere, causes the holding mechanism to move the substrates from the treating position to the drying position, operates the first decompressing device to decompress the chamber to the first pressure, and operates the second decompressing device to adjust the pressure in the buffer tank to the second pressure equal to or lower than the first pressure before the treating liquid in the treating tank is discharged into the buffer tank. Thus, the pressure in the chamber and the pressure in the buffer tank are equal, or the pressure in the buffer tank is lower. Therefore, even in the decompressed solvent atmosphere, the treating liquid can be discharged from the treating tank to the buffer tank, to improve the throughput of substrate treatment. Moreover, since there is no need for pressurization inside the chamber, the substrates can be dried clean without being adversely influenced by pressurization.

In another aspect of the invention, a substrate treating apparatus is provided for drying substrates by moving the substrates out of a treating liquid into a solvent atmosphere, the apparatus comprising a treating tank for storing the treating liquid; a chamber enclosing the treating tank; a holding mechanism for holding the substrates, the holding mechanism being vertically movable between a treating position in the treating tank and a drying position in the chamber and above the treating tank; a supply device for supplying vapor of a solvent into the chamber; a buffer tank disposed outside the chamber for collecting the treating liquid discharged from the treating tank into the chamber; a first decompressing device for decompressing the chamber; a second decompressing device for decompressing the buffer tank; and a control device for operating the supply device to fill the chamber with the solvent atmosphere, operating the holding mechanism to move the substrates from the treating position to the drying position, operating the first decompressing device to decompress the chamber to a first pressure, and operating the second decompressing device to adjust a pressure in the buffer tank to a second pressure equal to or lower than the first pressure before the treating liquid discharged into the chamber is discharged into the buffer tank.

According to this invention, the control device fills the chamber with a solvent atmosphere, causes the holding mechanism to move the substrates from the treating position to the drying position, operates the first decompressing device to decompress the chamber to the first pressure, and operates the second decompressing device to adjust the pressure in the buffer tank to the second pressure equal to or lower than the first pressure before the treating liquid discharged into the chamber is discharged into the buffer tank. Thus, the pressure in the chamber and the pressure in the buffer tank are equal, or the pressure in the buffer tank is lower. Therefore, even if the chamber is filled with the decompressed solvent atmosphere, the treating liquid can be discharged from the chamber to the buffer tank to improve the throughput of substrate treatment. Moreover, since there is no need for pressurization inside the chamber, the substrates can be dried clean without being adversely influenced by pressurization.

In this invention, the control device may be arranged to adjust the pressure in the buffer tank to the second pressure before the chamber is decompressed to the first pressure.

Since the pressure in the chamber and the pressure in the buffer tank are adjusted at different times, the first compressing device and second compressing device can be combined into one. Thus, the construction can be simplified, and the cost of the apparatus can be reduced.

In this invention, the treating tank may include filling pipes for filling the treating liquid therein, the first decompressing device being arranged to effect decompression through the filling pipes also.

The chamber may be decompressed efficiently by effecting decompression through the filling pipes also.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2 is a view showing operating states of various components for each process;

FIG. 4 is a view showing operating states of various components for each process.

DESCRIPTION OF THE PREFERRED EMBODIMENTS

Embodiment 1

Embodiment 1 of this invention will be described hereinafter with reference to the drawings.

Figure 1:
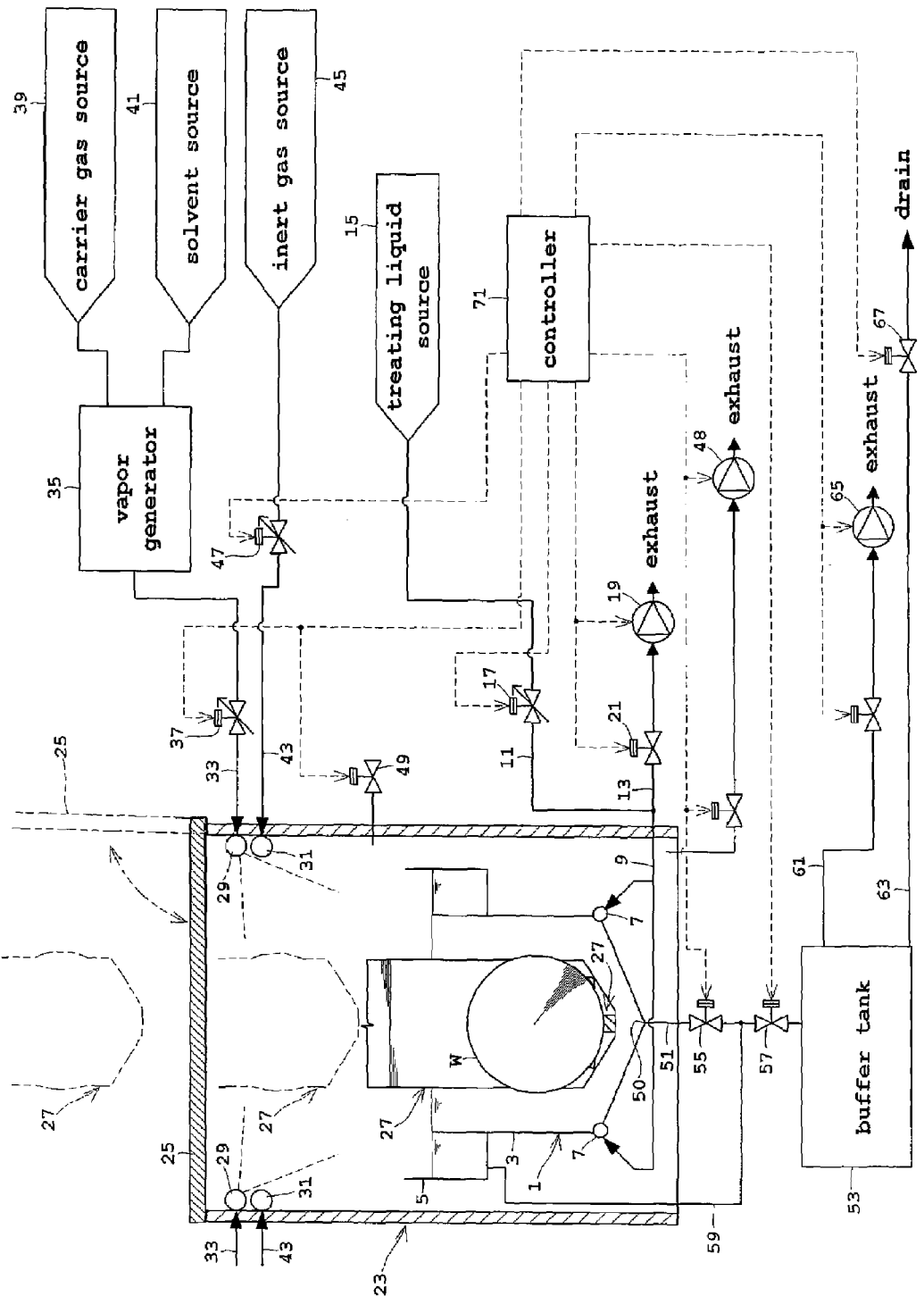
FIG. 1 is a block diagram showing an outline of a substrate treating apparatus in Embodiment 1.

FIG. 1 is a block diagram showing an outline of a substrate treating apparatus in Embodiment 1.

The substrate treating apparatus in this embodiment has a treating tank 1 for storing treating liquids. The treating tank 1 includes an inner tank 3 for storing the treating liquids and receiving wafers W, and an outer tank 5 for collecting the treating liquids overflowing the inner tank 3. The inner tank 3 has two filling pipes 7 disposed in the bottom thereof for supplying the treating liquids into the inner tank 3. The filling pipes 7 are connected to piping 9. The piping 9 forks into a feed pipe 11 and a suction pipe 13. The feed pipe 11 is connected to a treating liquid source 15, and has a treating liquid valve 17 consisting of a control valve for controlling a flow rate through the feed pipe 11. The suction pipe 13 is connected to a first vacuum pump 19, and is opened and closed by a switch valve 21. The treating liquid source 15 supplies, as treating liquids, chemicals such as hydrofluoric acid (HF) and a mixed solution of sulfuric acid ($H_2SO_4$) and hydrogen peroxide solution ($H_2O_2$), and deionized water.

The treating tank 1 is enclosed in a chamber 23. The chamber 23 has an openable top cover 25. A lifter 27 for holding wafers W in vertical posture is movable between a "standby position" above the chamber 23, a "treating position" inside the inner tank 3, and a "drying position" above the inner tank 3 and inside the chamber 23. A pair of solvent nozzles 29 and a pair of inert gas nozzles 31 are arranged under the top cover 25.

The solvent nozzles 29 are connected to one end of a feed pipe 33, the other end thereof being connected to a vapor generator 35. The feed pipe 33 has a vapor valve 37 consisting of a control valve mounted thereon for adjusting a flow rate through the feed pipe 33. The vapor generator 35 is supplied with an inert gas such as nitrogen as carrier gas from a carrier gas source 39, and a solvent such as isopropyl alcohol from a solvent source 41. The vapor generator 35 vaporizes the solvent from the solvent source 41, mixes it with the carrier gas, and supplies the mixture at a predetermined temperature to the feed pipe 33.

The inert gas nozzles 29 are connected to one end of a feed pipe 43, the other end thereof being connected to an inert gas source 45 that supplies an inert gas such as nitrogen gas. The feed rate of the inert gas is adjusted by an inert gas valve 47.

The chamber 23 has a second vacuum pump 48 connected thereto for exhausting internal gas to decompress the chamber 23. A breather valve 49 consisting of a switch valve is attached to the chamber 23 for canceling the decompression of the chamber 23.

The first vacuum pump 19 and second vacuum pump 48 correspond to the decompressing devices. The lifter 27 corresponds to the holding mechanism in this invention.

The inner tank 3 has an outlet port 50 formed in the bottom thereof. The outlet port 50 is connected to one end of a drain pipe 51. The other end of the drain pipe 51 is connected to a buffer tank 53 disposed outside the chamber 23. The drain pipe 51 has two control valves arranged in series thereon. The upstream valve is a QDR valve 55, and the downstream valve a drain valve 57. A drain pipe 59 has one end thereof connected to the outer tank 5, and the other end connected to the drain pipe 51 between the above two valves.

The buffer tank 53 has a buffer tank suction pipe 61 and a buffer tank drain pipe 63 connected thereto. The buffer tank suction pipe 61 has a third vacuum pump 65 mounted thereon. The buffer tank drain pipe 63 has a buffer tank drain valve 67 consisting of a control valve mounted thereon.

The first vacuum pump 19, switch valve 21, top cover 25, lifter 27, inert gas valve 47, second vacuum pump 48, breather valve 49, QDR valve 55, drain valve 57, third vacuum pump 65 and buffer tank drain valve 67 noted above are operable under overall control of a controller 71 which corresponds to the control device in this invention.

Next, operation of the apparatus having the above construction will be described with reference to FIG. 2. FIG. 2 is a view showing operating states of various components for each process. In FIG. 2, the frames marked "open" indicate that the valves are opened, and the blank frames indicate "closed" states of the valves. Similarly, the frames marked "ON" indicate that the pumps are operated, and the blank frames indicate that the pumps are "stopped".

The controller 71 opens the top cover 25, and moves the lifter 27 holding a plurality of wafers W to be treated from the "standby position" to the "drying position" (step S1). At this time, the drain valve 57 is kept open. Next, the controller 71 performs a process of reducing oxygen concentration in the chamber 23 (step S2). Specifically, the inert gas valve 47 and breather valve 49 are opened to supply the inert gas from the inert gas source 45 into the chamber 23. As a result, the air in the chamber 23 is purged by the inert gas, thereby to reduce oxygen concentration therein.

When the oxygen concentration in the chamber 23 has been reduced, the controller 71 opens the treating liquid valve 17 and drain valve 57. As a result, a chemical solution is supplied as a treating liquid from the treating liquid source 15 into the inner tank 3, and the overflowing treating liquid is collected in the outer tank 5. The collected treating liquid is collected in the buffer tank 53 through the drain pipe 59, and discharged through the buffer tank drain pipe 63. After the treating liquid is supplied in this way, the controller 71 lowers the lifter 27 from the drying position to the treating position, and maintains the lifter 27 in the treating position for a predetermined time to treat the wafers W with the treating liquid (step S3).

Upon lapse of the predetermined time from start of the chemical treatment, the controller 71, while maintaining the lifter 27 in the treating position, supplies deionized water as a treating liquid from the treating liquid source 15 in place of the chemical solution. This state is maintained for a predetermined time to clean the wafers W with the deionized water (step S4).

When the deionized water cleaning is completed, the controller 71 closes the treating liquid valve 17 to stop the supply of deionized water. Further, the vapor valve 37 is opened to supply the vapor of isopropyl alcohol (IPA) as heated to the predetermined temperature from the vapor generator 35. As a result, the surface of the deionized water stored in the inner tank 3 is replaced by the vapor of isopropyl alcohol (step S5).

After maintaining the above surface replacement by isopropyl alcohol for a predetermined time, the controller 71 closes the breather valve 49 and buffer tank drain valve 67. When this state is maintained for a predetermined time, the vapor of isopropyl alcohol will fill the chamber 23, to render the inside of chamber 23 a solvent atmosphere (step S6).

Subsequently, the controller 71 moves the lifter 27 from the treating position to the drying position. As a result, the deionized water adhering to the surfaces of wafers W begins to be replaced by the vapor of isopropyl alcohol (step S7).

After starting the replacement by the vapor, the controller 71 closes the inert gas valve 47, and operates the second vacuum pump 48 and third vacuum pump 65. As a result, the chamber 23 begins to be decompressed, which starts a reduced pressure drying of the wafers W in the drying position inside the chamber 23 (step S8). The decompression is effected at this time to a first pressure PS1. Further, the buffer tank 53 is decompressed by the third vacuum pump 65. The decompression is effected at this time to a second pressure PS2. The second pressure PS2 is equal to or lower than the first pressure PS1.

With start of the reduced pressure drying, the controller 71 quickly drains deionized water remaining in the inner tank 3 (step S9). This is done to avoid the adverse influence on the drying treatment by a large quantity of deionized water present in the chamber 23. The controller 71 opens the QDR valve 55. Then, the deionized water stored in the inner tank 3 is discharged into the buffer tank 53 through the drain pipe 51.

Upon completion of the quick draining, the drain valve 57 and QDR valve 55 are closed. Further, the first vacuum pump 19 is operated to reduce pressure also through the filling pipes 7 (step S10). The chamber 23 can be decompressed efficiently by reducing pressure also through the filling pipes 7. However, controls are carried out so that this decompression will not reduce the pressure in the chamber 23 below the second pressure PS2.

After a predetermined time of reduced pressure drying, a pressure recovery is carried out (step S11). Specifically, the first to third vacuum pumps 19, 48 and 65 are stopped. The QDR valve 55, drain valve 57, inert gas valve 47 and breather valve 49 are opened. As a result, the pressure in the chamber 23 lowered to the first pressure PS1 is recovered to atmospheric pressure.

After the pressure recovery, the controller 71 closes the QDR valve 55, drain valve 57, inert gas valve 47 and the breather valve 49, and raises the lifter 27 from the drying position to the standby position outside the chamber 23 for unloading the wafers W (step S12). Subsequently, the controller 71 closes the top cover 25 of the chamber 23, opens the treating liquid valve 17 to fill the inner tank 3 with the treating liquid, and opens the inert gas valve 47 to fill the chamber 23 with the inert gas (step S13).

As described above, the controller 71 fills the chamber 23 with a solvent atmosphere, causes the lifter 27 to carry wafers W from the treating position to the drying position, operates the second vacuum pump 48 to decompress the chamber 23 to the first pressure PS1, and operates the third vacuum pump 65 to adjust the pressure in the buffer tank 53 to the second pressure PS2 equal to or lower than the first pressure PS1 before discharging the treating liquid in the inner tank 3 into the buffer tank 53. Thus, the pressure in the chamber 23 and the pressure in the buffer tank 53 are equal, or the pressure in the buffer tank 53 is lower. Therefore, even in the decompressed solvent atmosphere, the treating liquid can be discharged from the inner tank 3 to the buffer tank 53, to improve the throughput of treatment of the wafers W. Moreover, since there is no need for pressurization inside the chamber 23, the wafers W can be dried clean without being adversely influenced by pressurization.

Embodiment 2

Next, Embodiment 2 of this invention will be described with reference to the drawings.

Figure 3:
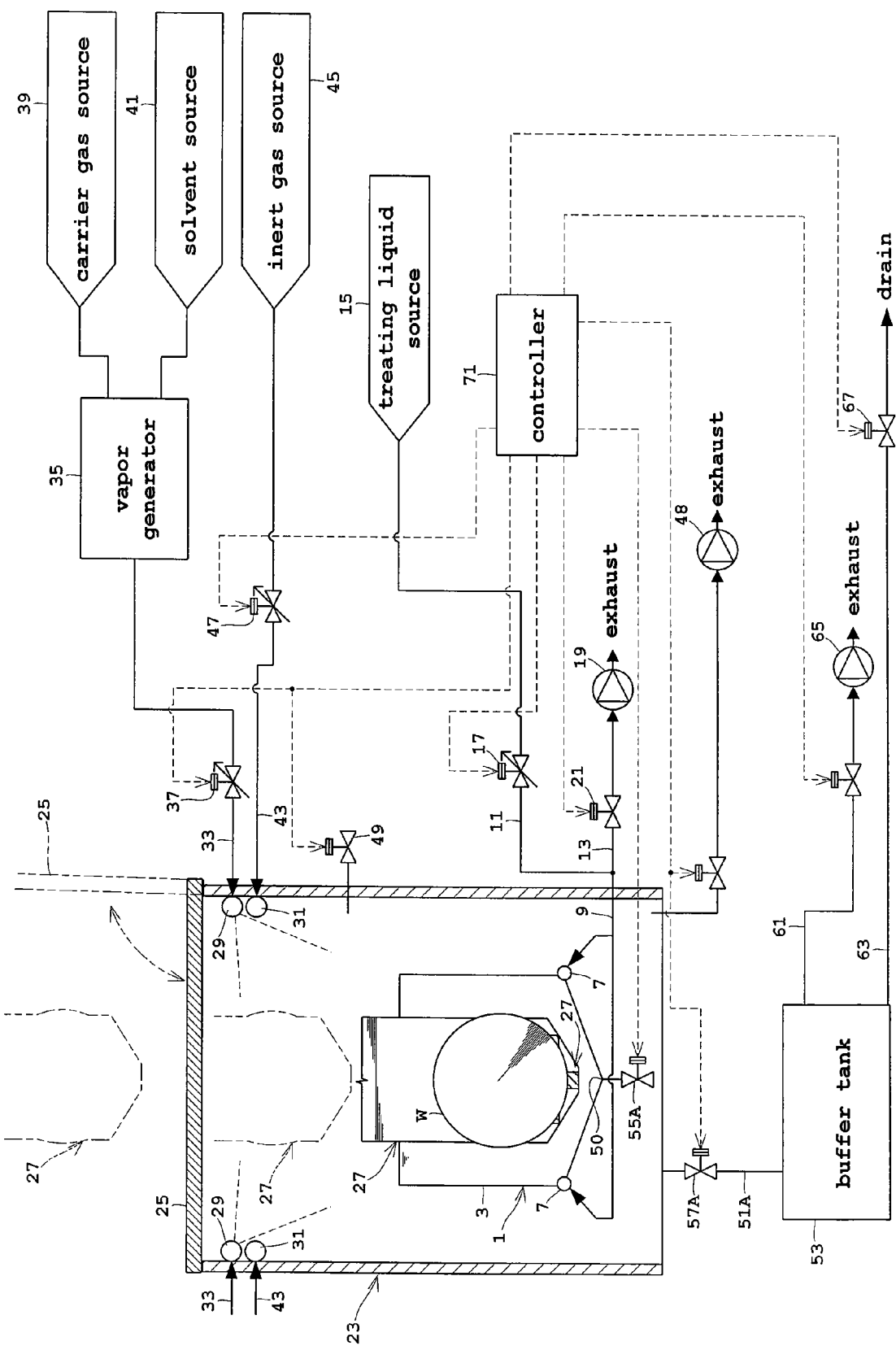
FIG. 3 is a block diagram showing an outline of a substrate treating apparatus in Embodiment 2.

FIG. 3 is a block diagram showing an outline of a substrate treating apparatus in Embodiment 2. Like reference numerals are used to identify like parts which are the same as in Embodiment 1 and will not be described again.

The substrate treating apparatus in Embodiment 2 is different from the construction in Embodiment 1 in the following points.

That is, the treating tank 1 has only the inner tank 3, and not the outer tank 5. A QDR valve 55A is connected to the outlet port 50 of the inner tank 3. When the QDR valve 55A is opened, a treating liquid in the inner tank 3 is once discharged to the inside of the chamber 23. The chamber 23 has a drain pipe 51A attached to the bottom thereof and connected to the buffer tank 53. The drain pipe 51A has a drain valve 57A mounted thereon. By opening this drain valve 57A, the treating liquid stored in the bottom of the chamber 23 is discharged to the buffer tank 53.

Next, operation of the apparatus having the above construction will be described with reference to FIG. 4. FIG. 4 is a view showing operating states of various components for each process.

Up to the process of replacement by isopropyl alcohol on the wafer surfaces (step S7), the operation is the same as in Embodiment 1 and its description will be omitted. However, since the treating tank 1 has no outer tank 5, the treating liquids supplied in time of chemical cleaning and deionized water cleaning overflow the inner tank 3 to be collected at the bottom of the chamber 23, and collected in the buffer tank 53 through the drain pipe 51A, and discharged through the buffer tank drain pipe 63.

Upon completion of the process of replacement by isopropyl alcohol on the wafer surfaces, the controller 71 closes the inert gas valve 47 and vapor valve 37, and opens the QDR valve 55A, to discharge the treating liquid in the inner tank 3 into the chamber 23, and operates the third vacuum pump 65 (step S21). As a result, the treating liquid in the inner tank 3 is drained quickly, and the buffer tank 53 is decompressed. The pressure in the buffer tank 53 is reduced at this time to the second pressure PS2.

Next, the controller 71 opens the drain valve 57A, and operates the first vacuum pump 19 and second vacuum pump 48 to decompress the chamber 23 (step S22). The pressure in the chamber 23 at this time is the first pressure PS1. This promotes drying of the wafers W, and causes the treating liquid stored in the bottom of the chamber 23 to be discharged into the buffer tank 53, the latter having an internal pressure equal to or lower than the pressure in the chamber 23.

As described above, the controller 71 fills the chamber 23 with a solvent atmosphere, causes the lifter 27 to carry wafers W from the treating position to the drying position, operates the second vacuum pump 48 to decompress the chamber 23 to the first pressure PS1, and operates the third vacuum pump 65 to adjust the pressure in the buffer tank 53 to the second pressure PS2 equal to or lower than the first pressure PS1 before discharging into the buffer tank 53 the treating liquid discharged from the inner tank 3 into the chamber 23. Thus, the pressure in the chamber 23 and the pressure in the buffer tank 53 are equal, or the pressure in the buffer tank 53 is lower. Therefore, even in the decompressed solvent atmosphere, the treating liquid can be discharged from the chamber 23 to the buffer tank 53 to improve throughput. Moreover, since there is no need for pressurization inside the chamber 23, the wafers W can be dried clean without being adversely influenced by pressurization.

This invention is not limited to the foregoing embodiments, but may be modified as follows:

(1) It is not absolutely necessary to carry out decompression through the filling pipes 7 by the first vacuum pump 19. Decompression may be carried out only by the second vacuum pump 48. Then, the number of vacuum pumps and the piping serving for decompression can be lessened.

(2) The compression of the buffer tank 53 will serve the purpose only if done before the quick draining process. For example, the decompression of the buffer tank 53 may be completed by the time of replacement on the wafer surfaces by isopropyl alcohol (step S7). Specifically, the second vacuum pump 48 and third vacuum pump 65 may consist of one vacuum pump, and a switch valve may be used to select the chamber 23 or the buffer tank 53. This will simplify the construction of the apparatus.

(3) In each of Embodiments 1 and 2 described hereinbefore, the construction employed discharges the treating liquids supplied to the treating tank 1. The apparatus may be the type that circulates the treating liquids.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for drying substrates by moving the substrates out of a treating liquid into a solvent atmosphere, comprising:
   a treating tank for storing the treating liquid;
   a chamber enclosing said treating tank;
   a holding mechanism for holding the substrates, said holding mechanism being vertically movable between a treating position in said treating tank and a drying position in said chamber and above said treating tank;
   a supply device for supplying vapor of a solvent into said chamber;
   a buffer tank disposed outside said chamber for collecting the treating liquid discharged from said treating tank;
   a first decompressing device for decompressing said chamber;
   a second decompressing device for decompressing said buffer tank; and
   a control device for operating said supply device to fill said chamber with the solvent atmosphere, operating said holding mechanism to move the substrates from the treating position to the drying position, operating said first decompressing device to decompress said chamber to a first pressure, and operating said second decompressing device to adjust a pressure in said buffer tank to a second pressure equal to or lower than said first pressure before the treating liquid in said treating tank is discharged into said buffer tank.

2. An apparatus as defined in claim 1, wherein said control device is arranged to adjust the pressure in said buffer tank to the second pressure before said chamber is decompressed to the first pressure.

3. An apparatus as defined in claim 2, wherein said treating tank includes filling pipes for filling the treating liquid therein, said first decompressing device being arranged to effect decompression through said filling pipes also.

4. An apparatus as defined in claim 3, wherein said chamber includes inert gas nozzles arranged in upper positions thereof for supplying an inert gas.

5. An apparatus as defined in claim 2, wherein said chamber includes inert gas nozzles arranged in upper positions thereof for supplying an inert gas.

6. An apparatus as defined in claim 2, wherein said chamber includes a breather valve for canceling decompression.

7. An apparatus as defined in claim 1, wherein said treating tank includes filling pipes for filling the treating liquid therein, said first decompressing device being arranged to effect decompression through said filling pipes also.

8. An apparatus as defined in claim 7, wherein said chamber includes inert gas nozzles arranged in upper positions thereof for supplying an inert gas.

9. An apparatus as defined in claim 1, wherein said chamber includes inert gas nozzles arranged in upper positions thereof for supplying an inert gas.

10. An apparatus as defined in claim 1, wherein said chamber includes a breather valve for canceling decompression.

11. A substrate treating apparatus for drying substrates by moving the substrates out of a treating liquid into a solvent atmosphere, comprising:
    a treating tank for storing the treating liquid;
    a chamber enclosing said treating tank;
    a holding mechanism for holding the substrates, said holding mechanism being vertically movable between a treating position in said treating tank and a drying position in said chamber and above said treating tank;
    a supply device for supplying vapor of a solvent into said chamber;
    a buffer tank disposed outside said chamber for collecting the treating liquid discharged from said treating tank into said chamber;
    a first decompressing device for decompressing said chamber;
    a second decompressing device for decompressing said buffer tank; and
    a control device for operating said supply device to fill said chamber with the solvent atmosphere, operating said holding mechanism to move the substrates from the treating position to the drying position, operating said first decompressing device to decompress said chamber to a first pressure, and operating said second decompressing device to adjust a pressure in said buffer tank to a second pressure equal to or lower than said first pressure before the treating liquid discharged into said chamber is discharged into said buffer tank.

12. An apparatus as defined in claim 11, wherein said control device is arranged to adjust the pressure in said buffer tank to the second pressure before said chamber is decompressed to the first pressure.

13. An apparatus as defined in claim 12, wherein said treating tank includes filling pipes for filling the treating liquid therein, said first decompressing device being arranged to effect decompression through said filling pipes also.

14. An apparatus as defined in claim 13, wherein said chamber includes inert gas nozzles arranged in upper positions thereof for supplying an inert gas.

15. An apparatus as defined in claim 12, wherein said chamber includes inert gas nozzles arranged in upper positions thereof for supplying an inert gas.

16. An apparatus as defined in claim 12, wherein said chamber includes a breather valve for canceling decompression.

17. An apparatus as defined in claim 11, wherein said treating tank includes filling pipes for filling the treating liquid therein, said first decompressing device being arranged to effect decompression through said filling pipes also.

18. An apparatus as defined in claim 17, wherein said chamber includes inert gas nozzles arranged in upper positions thereof for supplying an inert gas.

19. An apparatus as defined in claim 11, wherein said chamber includes inert gas nozzles arranged in upper positions thereof for supplying an inert gas.

20. An apparatus as defined in claim 11, wherein said chamber includes a breather valve for canceling decompression.

* * * * *